(12) United States Patent
Choi et al.

(10) Patent No.: US 9,360,186 B2
(45) Date of Patent: Jun. 7, 2016

(54) OPTICAL LENS, LIGHT EMITTING DEVICE ARRAY MODULE HAVING THE SAME AND LIGHT APPARATUS THEREOF

(71) Applicant: LG INNOTEK CO., LTD., Seoul (KR)

(72) Inventors: Hyun Ho Choi, Seoul (KR); Leeim Kang, Seoul (KR); ChangGyun Son, Seoul (KR); Chang Hyuck Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/106,106

(22) Filed: Dec. 13, 2013

(65) Prior Publication Data
US 2014/0168970 A1 Jun. 19, 2014

(30) Foreign Application Priority Data

Dec. 13, 2012 (KR) .......................... 10-2012-0145066

(51) Int. Cl.
*G02B 3/02* (2006.01)
*F21V 5/04* (2006.01)
*F21V 17/10* (2006.01)
*G02B 19/00* (2006.01)
(Continued)

(52) U.S. Cl.
CPC ................. *F21V 5/04* (2013.01); *F21V 17/101* (2013.01); *G02B 19/0028* (2013.01); *G02B 19/0061* (2013.01); *F21Y 2101/02* (2013.01); *H05K 1/0274* (2013.01); *H05K 2201/09036* (2013.01); *H05K 2201/10106* (2013.01); *H05K 2201/10121* (2013.01)

(58) Field of Classification Search
CPC ....... F21V 5/04; F21V 7/0091; F21V 17/101; F21V 13/04; F21V 15/01; F21V 5/00; F21V 5/007; F21V 5/046; F21V 5/48; F21Y 2101/02; F21Y 2113/007; H01L 33/60; G02B 3/00; G02B 7/00; G02B 19/0028; G02B 19/0061; G02B 19/0066; G02B 3/04; F21S 48/1329; F21S 48/236; F21S 48/24; H05K 1/0274; H05K 2201/09036; H05K 2201/09072; H05K 2201/10121
USPC ............ 362/97.1, 97.2, 37.3, 249.01, 249.02, 362/311.01, 311.02, 326, 327, 329, 335; 349/56, 57, 58, 62
See application file for complete search history.

(56) References Cited

U.S. PATENT DOCUMENTS 6,243,350 B1 * 6/2001 Knight ................... B82Y 10/00
369/112.24
6,598,998 B2 * 7/2003 West et al. ..................... 362/307
(Continued)

FOREIGN PATENT DOCUMENTS

KR 10-2011-0005647 A 1/2011
KR 10-2011-0025896 A 3/2011

OTHER PUBLICATIONS

Office Action dated May 30, 2014 in Korean Application No. 10-2012-0145066.

*Primary Examiner* — Hargobind S Sawhney
(74) *Attorney, Agent, or Firm* — Saliwanchik, Lloyd & Eisenschenk (57) ABSTRACT

A optical lens includes a lens body having a first surface and a second surface opposite to the first surface and having a recessed round shape in a cross-sectional view relative to an optical axis, a plurality of first support members protruded from the first surface at a first length, and a flange unit disposed at a lateral surface connected to the first surface, wherein the flange unit has a base portion.

16 Claims, 8 Drawing Sheets

(51) Int. Cl.
*F21Y 101/02* (2006.01)
*H05K 1/02* (2006.01)

(56) References Cited

U.S. PATENT DOCUMENTS

| | | | |
|---|---|---|---|
| 6,755,556 B2* | 6/2004 | Gasquet et al. | 362/329 |
| 7,104,672 B2* | 9/2006 | Zhang | F21V 5/04 257/E33.073 |
| 7,222,995 B1* | 5/2007 | Bayat | F21L 4/027 359/728 |
| 7,306,351 B2* | 12/2007 | Chao | F21V 5/046 257/E33.073 |
| 7,322,721 B2* | 1/2008 | Noh | F21V 7/0091 257/E33.059 |
| 7,349,163 B2* | 3/2008 | Angelini et al. | 359/708 |
| 7,572,654 B2* | 8/2009 | Chang | H01L 33/58 257/98 |
| 8,029,163 B2* | 10/2011 | Chen et al. | 362/308 |
| 8,182,110 B2* | 5/2012 | Jiang et al. | 362/245 |
| 8,213,093 B2* | 7/2012 | Bak et al. | 359/718 |
| 8,231,248 B2* | 7/2012 | Fu | F21V 5/04 362/308 |
| 8,430,538 B2* | 4/2013 | Holder et al. | 362/311.02 |
| 8,613,532 B2* | 12/2013 | Fujii et al. | 362/311.02 |
| 8,926,114 B2* | 1/2015 | Park | G02B 19/0071 362/97.1 |
| 2006/0044806 A1* | 3/2006 | Abramov | F21V 5/007 362/337 |
| 2006/0208267 A1* | 9/2006 | Chin | H01L 33/58 257/98 |
| 2008/0100773 A1* | 5/2008 | Hwang et al. | 349/62 |
| 2008/0273327 A1* | 11/2008 | Wilcox et al. | 362/267 |
| 2010/0128489 A1* | 5/2010 | Holder et al. | 362/329 |
| 2011/0110097 A1* | 5/2011 | Fu | F21V 5/04 362/296.01 |
| 2011/0222294 A1* | 9/2011 | Fan | F21V 5/04 362/296.01 |

* cited by examiner

OPTICAL LENS, LIGHT EMITTING DEVICE ARRAY MODULE HAVING THE SAME AND LIGHT APPARATUS THEREOF

CROSS-REFERENCE TO RELATED APPLICATION

This application claims the benefit under 35 U.S.C. §119 of Korean Patent Application No. 10-2012-0145066, filed Dec. 13, 2012, which is hereby incorporated by reference in its entirety.

BACKGROUND OF THE DISCLOSURE

1. Field of the Invention

The teachings in accordance with exemplary and non-limiting embodiments of this disclosure generally relate to an optical lens, a LED Light Emitting Diode module having the optical lens and a back light assembly having the same.

2. Background

This section provides background information related to the present disclosure which is not necessarily prior art.

Recently, liquid crystal displays are widely used that are configured to display via images information of various electronic devices across a variety of multimedia fields, such as mobile phones, game machines, computer monitoring devices, note books and tablet computers.

The recently-developed LCDs Liquid Crystal Displays require very thin thickness and high luminance uniformity, and direct type or direct-lit backlight units are used for LCDs for realizing the thin thickness and high luminance uniformity. The direct type backlight unit may include, underneath a LCD, a Light emitting device array module mounted with a CCFL Cold-Cathode Fluorescent Lamp or a LED.

A conventional Light emitting device array module of direct type backlight unit includes an optical lens configured to diffuse light generated from the LED by covering the LED mounted on a substrate, where a support member arranged at a bottom of the optical lens is coated with bond, and the optical lens is fixed to the substrate by the support member.

However, when the support member of the optical lens is fixed to the substrate using the bond, a distance between the optical lens and the LED may change or the optical lens may be slantly arranged relative to the LED.

Thus, there is a need to address the abovementioned disadvantage.

BRIEF SUMMARY

This section provides a general summary of the disclosure, and is not a comprehensive disclosure of its full scope or all of its features.

Exemplary embodiments of the present disclosure provide an optical lens configured to prevent generation of a gap with a light emitting device and slant arrangement of light emitting device, a Light emitting device array module having the optical lens and a back light assembly having the same.

It should be emphasized, however, that the present disclosure is not limited to a particular disclosure, as explained above. It should be understood that other technical subjects not mentioned herein may be appreciated by those skilled in the art.

In one general aspect of the present disclosure, there is provided an optical lens, the optical lens comprising:

a lens body having a first surface, a second surface opposite to the first surface and having a recessed round shape in a cross-sectional view relative to an optical axis, and a third surface including a slant surface and extended from an edge portion of the second surface;

a plurality of first support members protruded from the lens body at a first length; and a flange unit extended from the third surface and having a base portion.

Preferably, but not necessarily, the lens body further includes a plurality of second support members protruded from the first surface at a second length shorter than the first length.

Preferably, but not necessarily, each of the plurality of first and second support members may take a shape of a pillar.

Preferably, but not necessarily, the first support members may be circularly arranged on the first surface, each spaced apart at an equal distance.

Preferably, but not necessarily, the second support members may be arranged at an outside of the first support members, and may be circularly arranged on the first surface.

Preferably, but not necessarily, the first surface may be a flat surface.

Preferably, but not necessarily, the flange unit includes a ring-shape.

Preferably, but not necessarily, the second surface of the lens body is formed narrower than the first surface in a cross-sectional view relative to an optical axis.

Preferably, but not necessarily, the lens body further includes an edge portion connected to a point formed by the third surface and the second surface.

Preferably, but not necessarily, the third surface of the lens body has a straight line shape.

In another general aspect of the present disclosure, there is provided a light emitting device array module, the light emitting device array module comprising:

a plurality of optical lenses including a lens body having a first surface, a second surface opposite to the first surface and having a recessed round shape in a cross-sectional view relative to an optical axis, and a third surface including a slant surface and extended from an edge portion of the second surface, a plurality of first support members protruded from the lens body at a first length, and a flange unit extended from the third surface and having a base portion;

a substrate including a plurality of light emitting devices below the first surface and grooves formed at each position corresponding to that of the first support members.

Preferably, but not necessarily, the lens body further includes a plurality of second support members each protruded from the first surface and having a second length shorter than the first length.

Preferably, but not necessarily, a distal end of the second support members contact the surface of the substrate.

Preferably, but not necessarily, the light emitting device is mounted at an upper surface of the substrate, below the first surface, and at an inner space of the first support members.

Preferably, but not necessarily, a gap is formed between a bottom surface of the groove and a distal end of the first support members, and the gap is filled with an adhesive material.

Preferably, but not necessarily, the first support members are circularly arranged on the first surface of the lens body, each spaced apart at an equal distance, and the second support members are arranged at a periphery of the first support members, and are circularly arranged on the first surface.

Preferably, but not necessarily, each of the first and second support members takes a shape of a pillar, the first support members are circularly arranged on the first surface, each at an equal distance, and the second support members are circularly arranged at an outside of the first support members arranged on the first surface.

Preferably, but not necessarily, the first surface is a flat surface.

In still another general aspect of the present disclosure, there is provided a light apparatus, the light apparatus comprising:

a light emitting device array module including optical lenses including a lens body having a first surface, a second surface opposite to the first surface and having a recessed round shape in a cross-sectional view relative to an optical axis, and a third surface including a slant surface and extended from an edge portion of the second surface, a plurality of first support members protruded from the lens body at a first length, and a flange unit extended from the third surface and having a base portion, a substrate including a plurality of light emitting devices below the first surface and grooves formed at each position corresponding to that of the first support members;

a bottom case configured to receive the light emitting device array module;

a reflective plate arranged on a floor plate of the bottom case to reflect light generated from the light emitting device; and an optical member coupled to an upper surface of the bottom case to improve a luminance characteristic of the light generated from the light emitting device.

Preferably, but not necessarily, the lens body further includes a plurality of second support members each protruded from the first surface and having a second length shorter than the first length.

The optical lens, the light emitting device array module having the optical lens and the light apparatus having the same according to exemplary embodiments of the present disclosure have advantageous effects in that a first support plate formed at a floor plate of the optical lens arranged on each LED mounted on a substrate is inserted into a groove formed on the substrate to be fixed on the substrate via an adhesive, a second support plate formed on the floor plate of the optical lens is brought into contact with an upper surface of the substrate to accurately form a gap required between the optical lens and the substrate, whereby the gap between the optical lens and the substrate is inhibited from being changed, or the optical lens is inhibited from being slanted.

BRIEF DESCRIPTION OF THE DRAWINGS

In the drawings, the width, length, thickness, etc. of components may be exaggerated or reduced for the sake of convenience and clarity. Furthermore, throughout the descriptions, the same reference numerals will be assigned to the same elements in the explanations of the figures, and explanations that duplicate one another will be omitted.

The teachings of the present disclosure can be readily understood by considering the following detailed description in conjunction with the accompanying drawings, in which.

DETAILED DESCRIPTION

Now, exemplary embodiments of the present invention will be described in detail with reference to the accompanying drawings.

In describing the present disclosure, certain layers, sizes, shapes, components or features may be exaggerated for clarity and convenience. Accordingly, the meaning of specific terms or words used in the specification and claims should not be limited to the literal or commonly employed sense, but should be construed or may be different in accordance with the intention of a user or an operator and customary usages. Therefore, the definition of the specific terms or words should be based on the contents across the specification.

Figure 1:
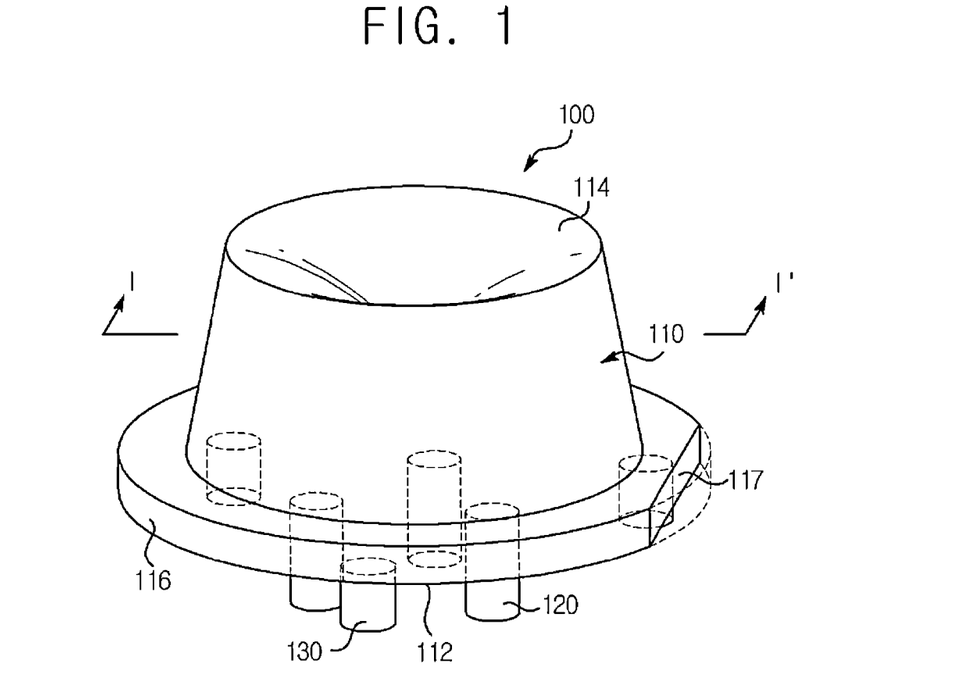
FIG. 1 is a perspective view illustrating an optical lens according to an exemplary embodiment of the present disclosure.
Figure 2A:
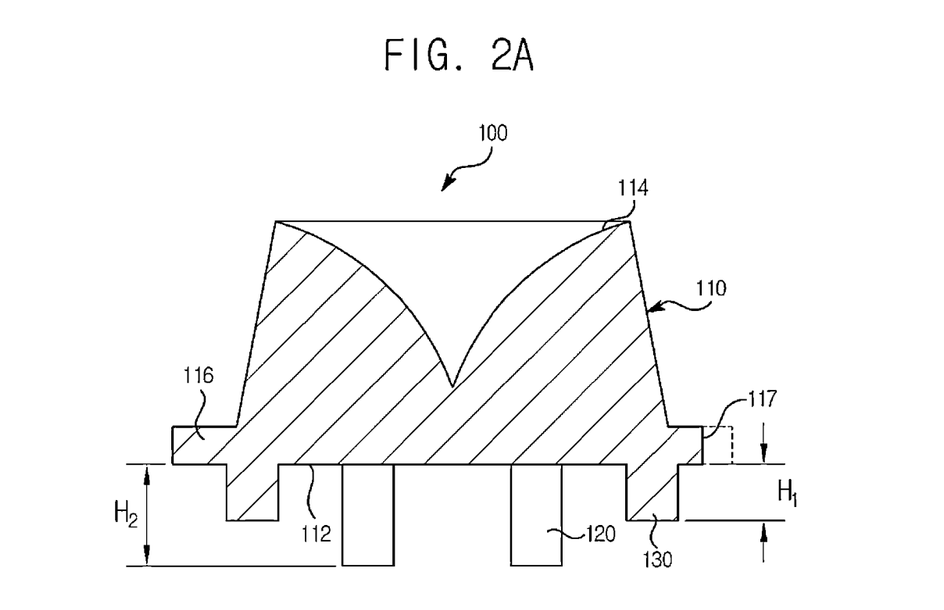
FIGS. 2A to 2C are cross-sectional views cut along line 'I-I' of FIG. 1.
Figure 2B:
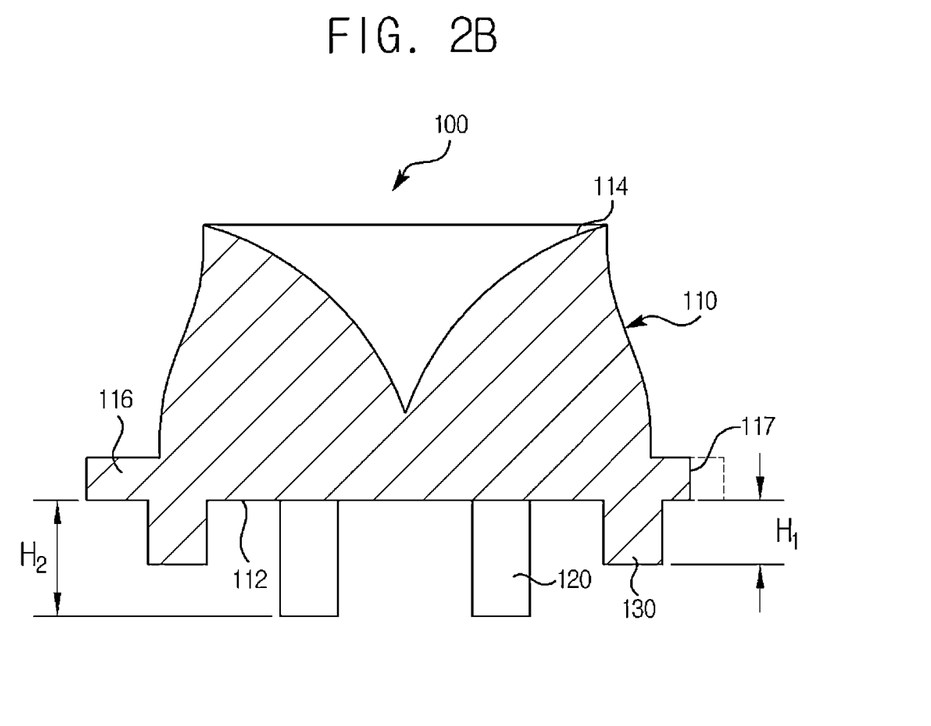
Figure 2C:
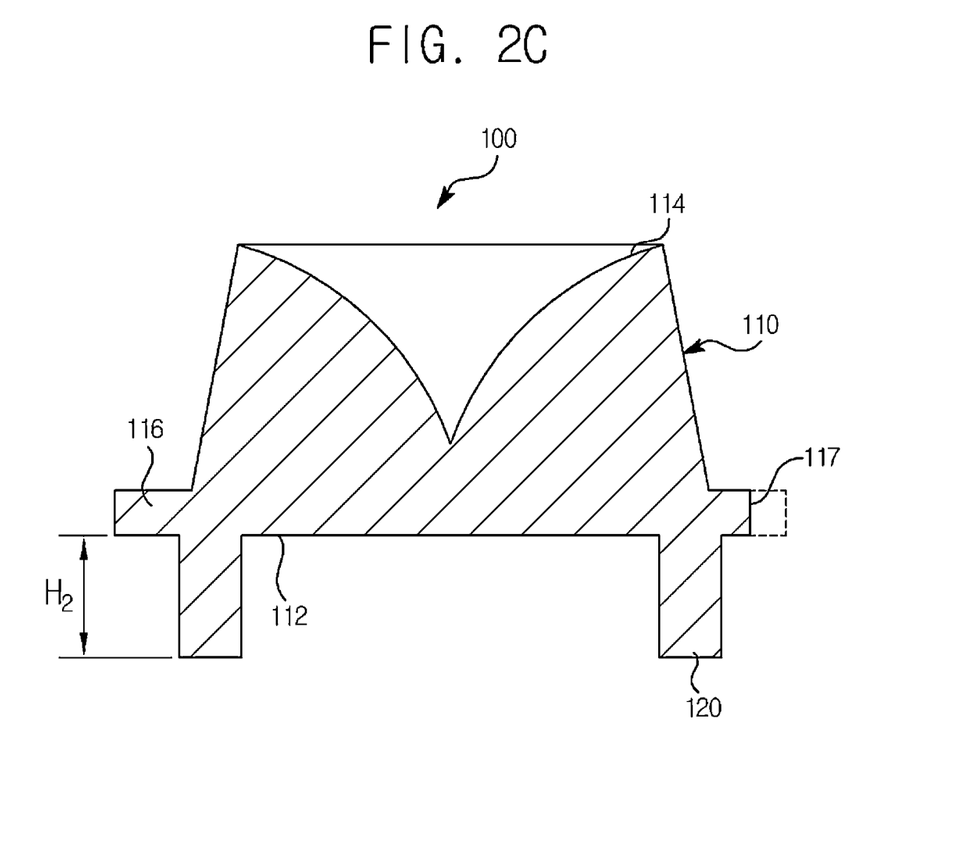

FIG. 1 is a perspective view illustrating an optical lens according to an exemplary embodiment of the present disclosure, FIGS. 2A to 2C are cross-sectional views cut along line 'I-I' of FIG. 1, and FIGS. 3A to 3C are plans illustrating a first surface of the optical lens of FIG. 1.

Referring to FIGS. 1, 2A, 2B, 3C, 3A, 3B and 3C, an optical lens 100 may include a lens body 110, a first support member 120 and a second support member 130.

The lens body 110 may include a first surface 112 and a second surface 114. The first surface 112 is a surface incident on by light and the second surface 114 is a surface configured to diffuse the incident light.

According to the exemplary embodiment of the present disclosure, a lateral wall of the lens body 110 may be straightly formed as illustrated in FIG. 2A, or may be provided in a shape of a curve having at least one inflection point as illustrated in FIG. 2B. However, the present disclosure is not limited thereto and the lateral wall of the lens body 110 may take any shapes according to a shape of the second surface 114, described later and may be freely designed according to design of optical system.

According to the exemplary embodiment of the present disclosure, the first surface 112 is a planar surface, and the second surface 114 may take a convex shape or a concave shape. For example, the second surface 114 according to the exemplary embodiment of the present disclosure may take a concave shape toward a center.

A third surface connected to the first surface 112 of the lens body 110 may be formed with a protrusive ring-shape flange unit 116.

The first support member 120 may be integrally formed with the first surface 112 of the lens body 110, and the first support member 120 may be formed along with the lens body 110 by injection molding process.

At least two first support members 120 may be formed on the first surface 112 of the lens body 110, and preferably more than three first support members may be formed, where each first support member 120 is circularly arranged on the first surface 112, and each first support member 120 may be spaced apart from the other first support member 120 at an equal gap. Furthermore, each first support member 120 takes a shape of a pillar.

According to the exemplary embodiment of the present disclosure, three first support members 120 may be formed on the first surface 112 of the lens body 110, each spaced apart at an equal distance. Each of the first support members 120 may be formed with a first length H1 when measured from the first surface 112 of the lens body 110. A distal end of the first support member 120 may be formed in a shape of a planar surface parallel with the first surface 112. Alternatively, a distal end of the second support member 130 may be formed in a round shape.

According to the exemplary embodiment of the present disclosure, the first support members 120 may be bonded to a substrate and functions to fix the lens body 110 to the substrate.

The second support member 130 may be integrally formed with the first surface 112 of the lens body 110, and the second support member 130 may be formed along with the lens body 110 and the first support body 120 by injection molding process.

According to the exemplary embodiment of the present disclosure, at least two second support members 130 may be formed on the first surface 112 of the lens body 110, and preferably three second support members 130 may be formed. Each of the second support members 130 may be circularly formed on the first surface 112, each spaced apart from the other at an equal gap, and may be formed in a shape of a pillar. For example, the second support member 130 may be circularly arranged at an external surface of the first support member 120 formed on the first surface 112 of the lens body 110.

The second support member 130 may be formed with a second length H2 shorter than the first length H1 when measured from the first surface 112 of the lens body 110. A distal end of the second support member 130 may be formed in a shape of a planar surface parallel with the first surface 112.

According to the exemplary embodiment of the present disclosure, the second support members 130 are brought into contact with an upper surface of the substrate without bond to maintain a gap between the substrate and the optical lens, and functions to prevent the optical lens from being slanted relative to the substrate.

Referring to FIGS. 2A, 2B, 3A and 3B, the flange unit 116 is protrusively formed on a periphery of the lens body 110 and an installation position of the lens body 110 may be regulated by the flange unit 116.

Particularly, a surface for rotation base is required for an anisotropic lens because of different beam angles, and the flange unit 116 may be protrusively formed at the periphery of the lens body 110 because a rotation base surface needs to be installed at a position that does not affect the optical system.

Figure 3A:
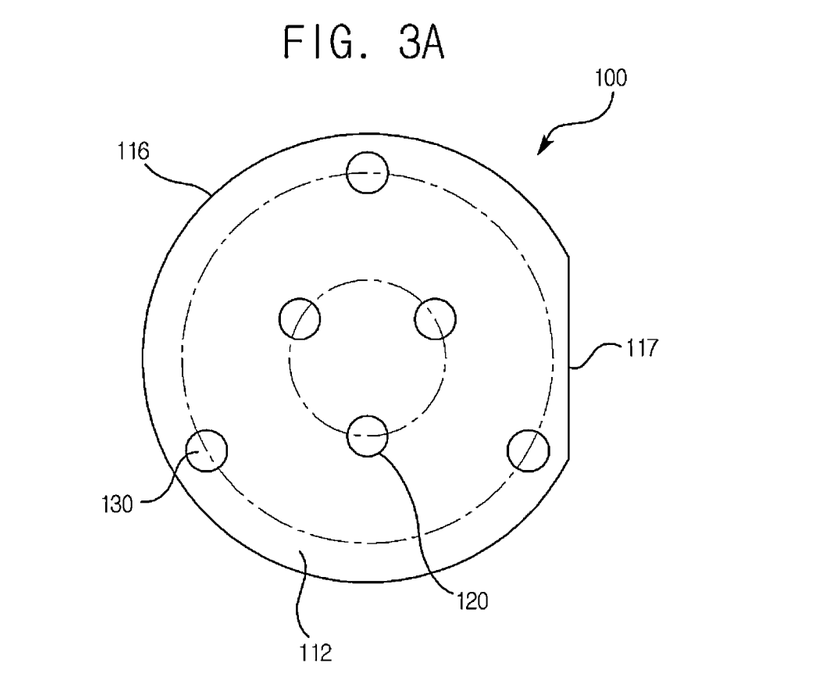
FIGS. 3A to 3C are plans illustrating a first surface of the optical lens of FIG. 1.
Figure 3B:
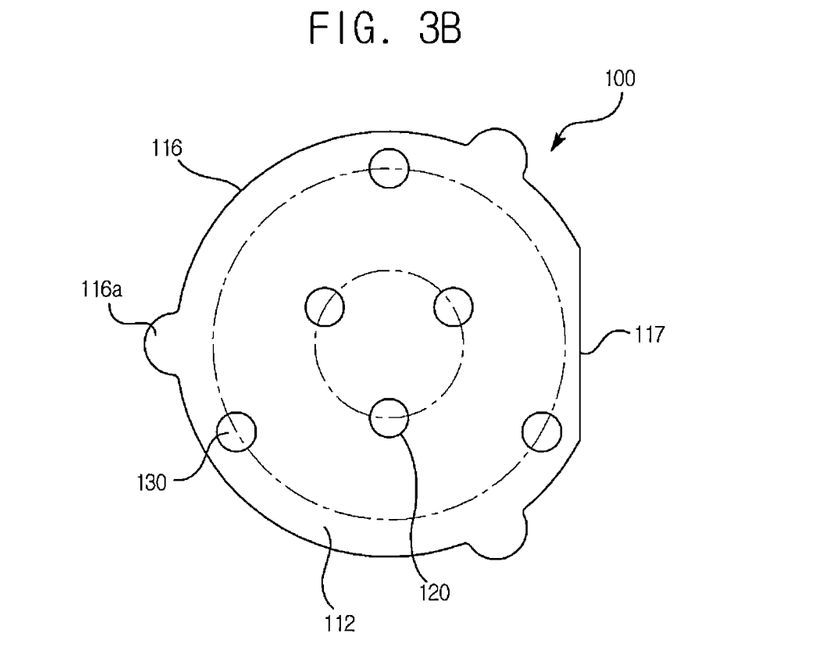

Meanwhile, referring to FIG. 3B, the flange unit 116 may be protrusively formed at a periphery with at least one grip protrusion 116a. The grip protrusion 116a is required for a manufacturing process of the optical lens 100, and is a mechanism to enable a transferring tool such as a lens-transporting jig to grip an optical lens 100.

The grip protrusion 116a prevents the lens body 110 or the flange unit 116 from interfering with the transferring tool in the transferring process, whereby manufactured lens bodies 110 can be prevented from being damaged.

Figure 3C:
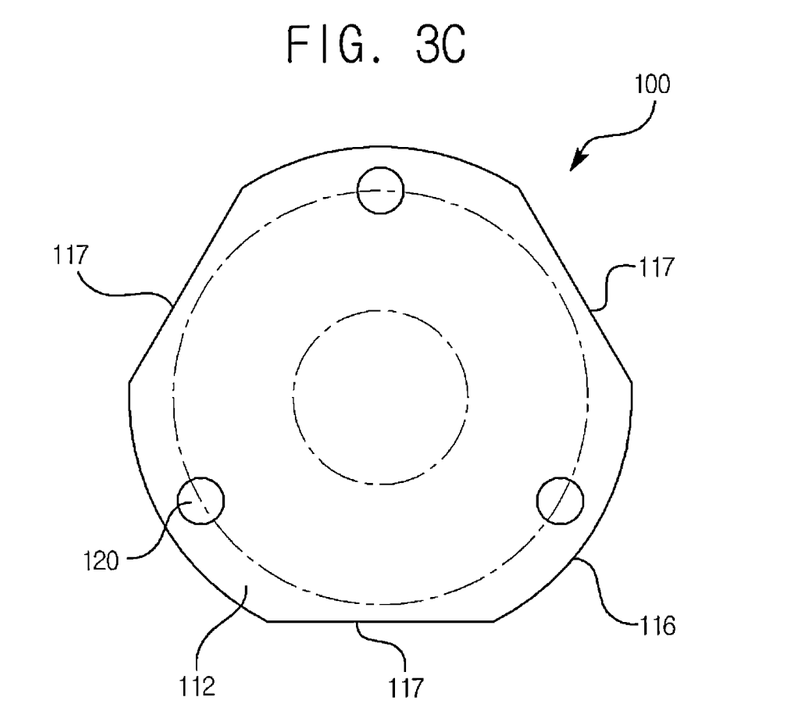

Meanwhile, referring to FIGS. 3B and 3C, the ring-shaped flange unit 116 formed on the lens body 110 may be partially cut to include one or more a basis portion 117 having a planar shape. The basis portion 117 is used as a rotation base for the optical lens 100, and in a case when the planar basis portion 117 is formed on a part of the ring-shaped flange unit 116 by partially cutting the flange unit 116, the optical lens 100 can be accurately mounted on the substrate to a designated direction when the optical lens 100 is mounted on the substrate.

According to the exemplary embodiment of the present disclosure, the planar basis portion 117 is formed by cutting a part of the flange unit 116, because the first support members 120 protruded from the first surface 112 of the lens body 110 are circularly arranged on the first surface 112 each at an equal distance. However, the present disclosure is not limited thereto, and the optical lens 100 may be coupled to the substrate to a designated direction by preventing the first support member 120 from being inserted into the substrate if not to a designated direction by forming the first support members 120 each at a different gap for setting a rotation base for the optical lens 100.

Figure 4A:
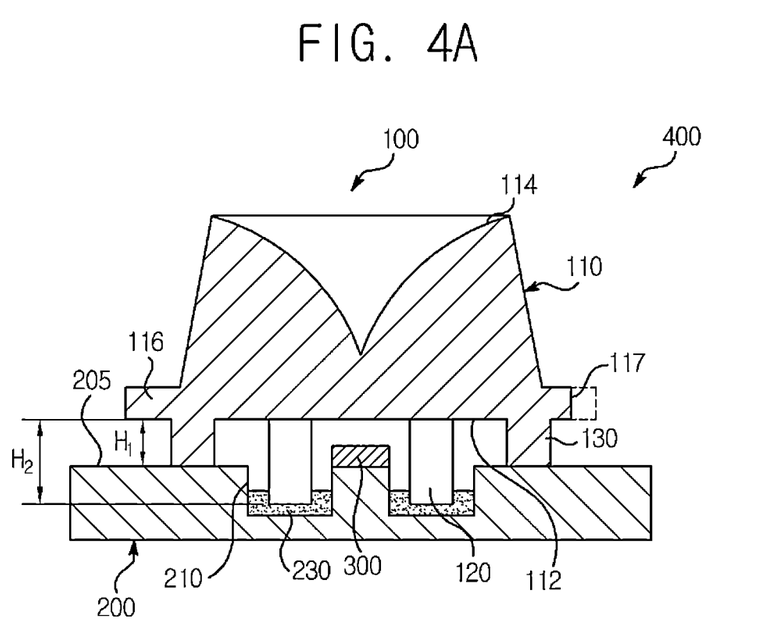
FIGS. 4A and 4B are a cross-sectional view illustrating a Light emitting device array module according to an exemplary embodiment of the present disclosure.
Figure 4B:
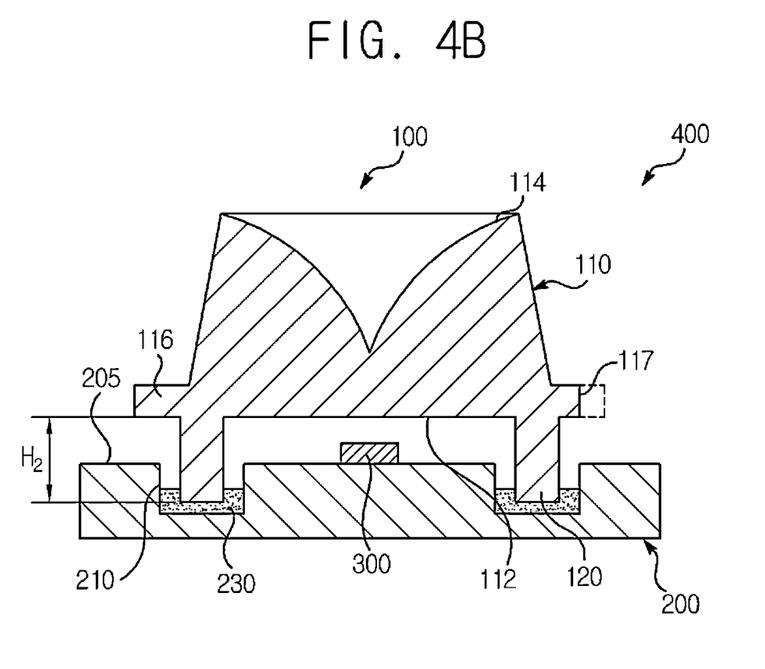

FIG. 4 is a cross-sectional view illustrating a Light emitting device array module according to an exemplary embodiment of the present disclosure.

Referring to FIG. 4, the optical lens 100 may include a lens body 110, a first support member 120 and a second support member 130.

The lens body 110 may include a first surface 112 and a second surface 114. The first surface 112 is a surface incident on by light and the second surface 114 is a surface configured to diffuse the incident light.

According to the exemplary embodiment of the present disclosure, the first surface 112 is a planar surface, and the second surface 114 may take a convex shape or a concave shape. For example, the second surface 114 according to the exemplary embodiment of the present disclosure may take a concave shape toward a center.

A third surface connected to the first surface 112 of the lens body 110 may be formed with a protrusive ring-shaped flange unit 116.

The first support member 120 may be integrally formed with the first surface 112 of the lens body 110, and the first support member 120 may be formed along with the lens body 110 by injection molding process.

At least two first support members 120 may be formed on the first surface 112 of the lens body 110, and preferably more than three first support members may be formed, where each first support member 120 is circularly arranged on the first surface 112, and each first support member 120 may be spaced apart from the other first support member 120 at an equal gap. Furthermore, each first support member 120 takes a shape of a pillar.

According to the exemplary embodiment of the present disclosure, three first support members 120 may be formed on the first surface 112 of the lens body 110, each spaced apart at an equal distance. Each of the first support members 120 may be formed with a first length H1 when measured from the first surface 112 of the lens body 110. A distal end of the first support member 120 may be formed in a shape of a planar surface parallel with the first surface 112. Alternatively, a distal end of the second support member 130 may be formed in a round shape.

The second support member 130 may be integrally formed with the first surface 112 of the lens body 110, and the second support member 130 may be formed along with the lens body 110 and the first support body 120 by injection molding process.

According to the exemplary embodiment of the present disclosure, at least two second support members 130 may be formed on the first surface 112 of the lens body 110, and preferably three second support members 130 may be formed on the first surface 112 of the lens body 110.

Each of the second support members 130 may be circularly formed on the first surface 112, each spaced apart from the other at an equal gap, and may be formed in a shape of a pillar. For example, the second support member 130 may be circularly arranged at an external surface of the first support member 120 formed on the first surface 112 of the lens body 110.

The second support member 130 may be formed with a second length H2 shorter than the first length H1 when measured from the first surface 112 of the lens body 110. A distal end of the second support member 130 may be formed in a shape of a planar surface parallel with the first surface 112.

Meanwhile, the ring-shaped flange unit 116 formed on the lens body 110 may be partially cut to include a base reference unit 117 having a planar shape.

A substrate 200 functions to fix the optical lens 100 and a light emitting device 300. The substrate 200 may be mechanically coupled to the optical lens 100 and may be electrically coupled to the light emitting device 300.

A groove 210 may be formed at an upper surface 205 of the substrate 200 opposite to the first surface 112 of the optical lens 100, and the groove 210 may be formed at a position corresponding to that of each first support member 120 formed on the first surface 112 of the optical lens 100, whereby each of the first support member 120 formed at the first surface 112 of the optical lens 100 may be received into the groove 210 formed at the upper surface 205 of the substrate 200.

An adhesive material 230 is arranged at an inside of the groove 210 formed on the upper surface 205 of the substrate 200, where the adhesive material 230 may be an epoxy resin having an adhesive property.

The second support member 130 protrusively formed from the first surface 112 of the optical lens 100 may be arranged at the upper surface 205 of the substrate 200, and according to the exemplary embodiment of the present disclosure, the second support unit 130 may be formed off from the groove 210 to be arranged on the upper surface 205 of substrate 200.

A distal end of the second support member 130 is tightly contacted to the upper surface 205 of substrate 200.

The first support member 120 formed on the first surface 112 of the optical lens 100 is inserted into the groove 210 formed at the upper surface 205 of the substrate 200 to contact the adhesive material 230 arranged inside the groove 210, while the distal end of the second support member 130 is tightly contacted to the upper surface 205 of substrate 200.

According to the exemplary embodiment of the present disclosure, a gap is formed between the distal end of the first support member 120 and a floor plate of the groove 210, while the distal end of the second support member 130 is tightly contacted to the upper surface 205 of substrate 200, and the adhesive material 230 is filled in between the distal end of the first support member 120 and a floor plate of the groove 210, whereby the first support member 120 and the substrate 200 are tightly and mutually coupled.

According to the exemplary embodiment of the present disclosure, a gap having a predetermined height may be formed in parallel between the first surface 112 of the optical lens 100 and the substrate 200 by the second support member 130 while the first support member 120 is coupled to the substrate 200 by the adhesive material 230, because no adhesive material is interposed between the distal end of the second support member 130 and the upper surface 205 of substrate 200.

The light emitting device 300 is arranged at the upper surface 205 of substrate 200, and the light emitting device 300 may be centrally arranged at the first support members 120, for example. The light emitting device 300 may be electrically connected to a circuit wiring of the substrate 200.

Light emitted from the light emitting device 300 has very low luminance uniformity, but the light of very low luminance uniformity may be incident from the first surface 112 of the optical lens 100 to greatly increase the luminance uniformity by being diffused after passing through the second surface 114.

Meanwhile, the optical lens 100 may be mounted on the substrate 200 to a designated direction by the basis portion 117 formed on a part of the flange unit 116 of the optical lens 100.

Figure 5:
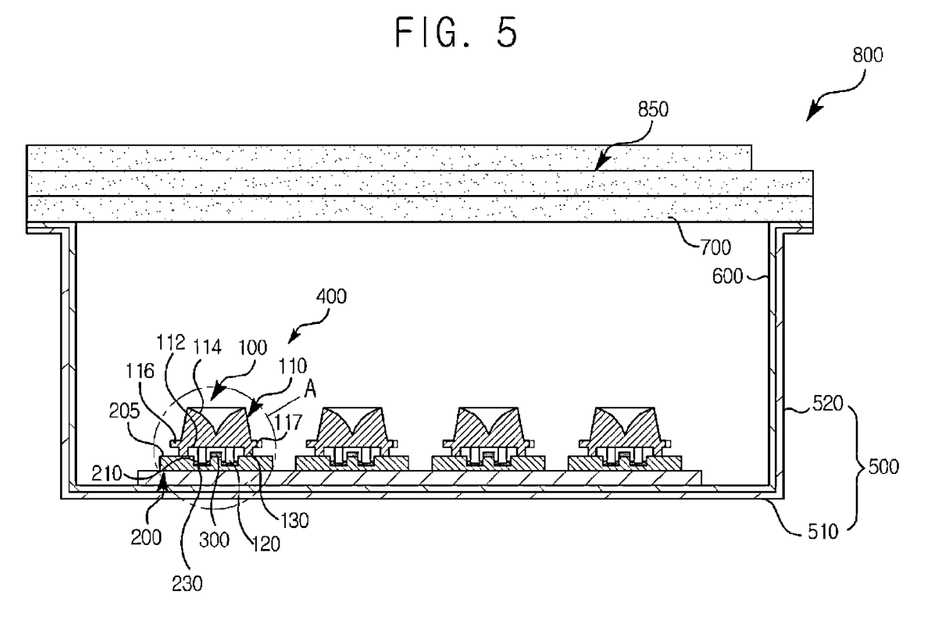
FIG. 5 is a cross-sectional view illustrating a light apparatus according to an exemplary embodiment of the present disclosure.

Referring to FIG. 5, a plurality of Light emitting device array modules may be arranged each at a predetermined gap to form a light emitting device array module. The light emitting device array module may be promptly formed in one row according to configuration of an installation device, or may be formed with a matrix shape having a predetermined number of rows and lines.

Figure 6:
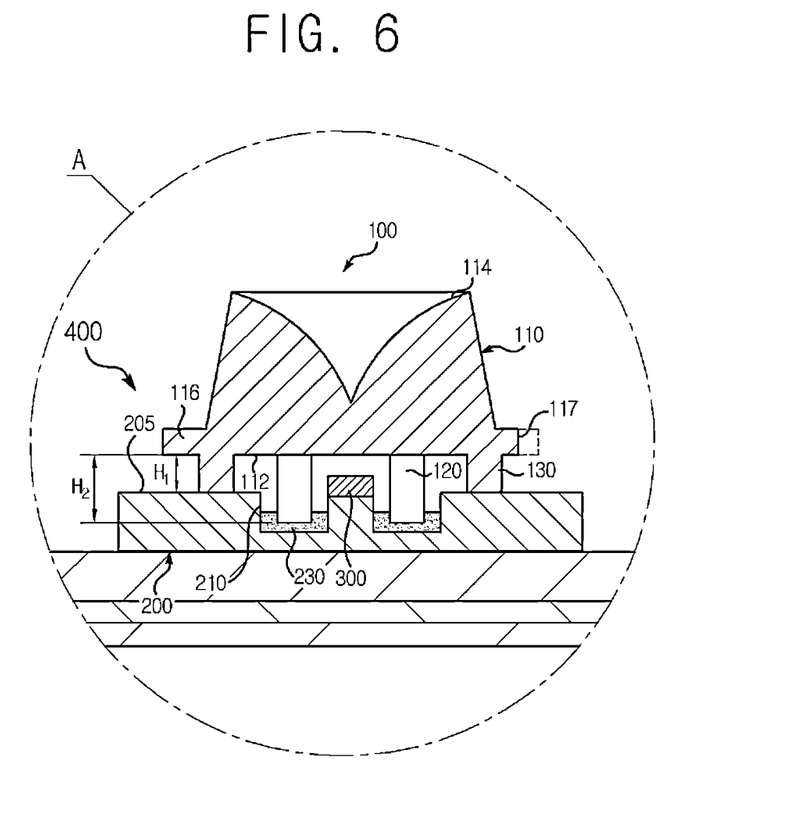
FIG. 6 is an enlarged view of 'A' portion of FIG. 5.

FIG. 5 is a cross-sectional view illustrating a light apparatus according to an exemplary embodiment of the present disclosure, and FIG. 6 is an enlarged view of 'A' portion of FIG. 5.

A light emitting device array module 400, which is a constituent element of a light apparatus according to an exemplary embodiment of the present disclosure, has the same configuration as that of the light emitting device array module illustrated in FIG. 4, such that redundant explanation to the substantially same configuration will be omitted and the same reference numerals will be assigned to the same elements in the explanations of the figures.

Referring to FIGS. 4, 5 and 6, a light apparatus 800 may include a Light emitting device array module 400, a bottom case 500, a reflective plate 600 and an optical member 700.

The bottom case 500 may include a lateral plate 520 extended from a floor plate 510 and a bottom plate 510 to form a receiving space. The reflective plate 600 may take a shape of a thin sheet, and may be formed with a material having a high optical reflectivity.

The reflective plate 600 functions to cover the floor plate 510 of the bottom case 500 and the lateral plate 520, and to reflect and diffuse, to the optical member 700, described later, the light emitted from the optical lens 100 by being generated from the light emitting device 300 of the light emitting device array module 400.

In some exemplary embodiments of the present disclosure, the light emitting device array module 400 may be arranged on the reflective plate 600 or interposed between the reflective plate 600 and the bottom plate 510 of the bottom case 500.

The optical member 700 may be arranged on the lateral plate 520 of the bottom case 500, and may include a diffusion plate configured to diffuse the light emitted from the optical lens 100 of the light emitting device array module 400 and/or a light guide plate configured to emit the light having passed the diffusion plate from an upper surface of the diffusion plate to a vertical direction.

A liquid crystal display panel 850 may be arranged at an upper surface of the optical member 700 of the light apparatus 800 according to the exemplary embodiment of the present disclosure.

As apparent from the foregoing, the optical lens, the light emitting device array module having the optical lens and the light apparatus having the same according to exemplary embodiments of the present disclosure have advantageous effect in that a first support plate formed at a floor plate of optical lens arranged on each light emitting device mounted on a substrate is inserted into a groove formed on the substrate to be fixed on the substrate via an adhesive, a second support plate formed on the floor plate of the optical lens is brought into contact with an upper surface of the substrate to accurately form a gap required between the optical lens and the substrate, whereby the gap between the optical lens and the substrate is prevented from being changed, or the optical lens is prevented from being slanted.

Although the present disclosure has been described with reference to a number of illustrative embodiments thereof, it should be understood that numerous other modifications and embodiments can be devised by those skilled in the art that will fall within the spirit and scope of the principles of this disclosure.

What is claimed is:

1. An optical lens, comprising:
a lens body having a first surface, a second surface opposite to the first surface and having a recessed round shape in a cross-sectional view relative to an optical axis, and a third surface extended downwardly from an edge portion of the second surface in a slanted manner with respect to the optical axis;
a plurality of first support members protruded downwardly at a first length;
a flange unit extended outwardly from the lens body; and
a plurality of second support members each protruded from the first surface and having a second length shorter than the first length;
wherein the plurality of first support members and the plurality of second support members are integrally formed with the first surface of the lens body;
wherein the third surface appears flat in a cross-sectional view of the lens body taken through a plane having the optical axis of the lens;
wherein the first surface is perpendicular to the optical axis and is flat; and
wherein the optical axis goes through the first surface, and the flange unit is adjacent to the first surface.

2. The optical lens of claim 1, wherein each of the plurality of first and second support members includes a shape of a pillar.

3. The optical lens of claim 1, wherein the first support members are circularly arranged on the first surface, each spaced apart at an equal distance.

4. The optical lens of claim 1, wherein the second support members are arranged at an outside of the first support members, and are circularly arranged on the first surface.

5. The optical lens of claim 1, wherein the flange unit includes a ring-shape.

6. The optical lens of claim 1, wherein the second surface of the lens body is formed narrower than the first surface in a cross-sectional view relative to an optical axis.

7. The optical lens of claim 6, wherein the lens body further includes an edge portion connected to a point formed by the third surface and the second surface.

8. A light emitting device array module, comprising:
a lens body having a first surface, a second surface opposite to the first surface and having a recessed round shape in a cross-sectional view relative to an optical axis, and a third surface extended downwardly from an edge portion of the second surface in a slanted manner with respect to the optical axis;
a plurality of first support members protruded from the lens body at a first length;
a flange unit extended outwardly from the lens body;
a substrate including a plurality of light emitting devices below the first surface and grooves formed at each position corresponding to those of the first support members; and
a plurality of second support members each protruded from the first surface and having a second length shorter than the first length;
wherein the plurality of first support members and the plurality of second support members are integrally formed with the first surface of the lens body;
wherein the third surface appears flat in a cross-sectional view of the lens body taken through a plane having the optical axis of the lens;
wherein the first surface is perpendicular to the optical axis and is flat; and
wherein the optical axis goes through the first surface, and the flange unit is adjacent to the first surface.

9. The light emitting device array module of claim 8, wherein a distal end of each second support member contacts an upper surface of the substrate.

10. The light emitting device array module of claim 8, wherein the light emitting device is mounted at an upper surface of the substrate, below the first surface, and at an inner space of the first support members.

11. The light emitting device array module of claim 8, wherein a gap is formed between a bottom surface of the grooves and a distal end of the first support members, and the gap is filled with an adhesive material.

12. The light emitting device array module of claim 11, wherein a distal end of each of the second support members is in direct physical contact with an upper surface of the substrate.

13. The light emitting device array module of claim 8, wherein the first support members are circularly arranged on the first surface of the lens body, each spaced apart at an equal distance, and the second support members are arranged at a periphery of the first support members, and are circularly arranged on the first surface.

14. The light emitting device array module of claim 8, wherein each of the first and second support members takes a shape of a pillar, the first support members are circularly arranged on the first surface, each at an equal distance, and the second support members are circularly arranged at an outside of the first support members arranged on the first surface.

15. A light apparatus, the light apparatus comprising:
a light emitting device array module including a plurality of optical lenses, wherein each optical lens includes:
a lens body having a first surface, a second surface opposite to the first surface and having a recessed round shape in a cross-sectional view relative to an optical axis, and a third surface extended downwardly from an edge portion of the second surface in a slanted manner with respect to the optical axis;
a plurality of first support members protruded downwardly from the lens body at a first length;
a plurality of second support members each protruded from the first surface and having a second length shorter than the first length; and
a flange unit extended outwardly from the lens body;
a substrate including a plurality of light emitting devices below the first surface and grooves formed at each position corresponding to those of the first support members;
a bottom case configured to receive the light emitting device array module;
a reflective plate arranged on a floor plate of the bottom case to reflect light generated from the light emitting device; and
an optical member arranged on a lateral plate of the bottom case to improve a luminance characteristic of the light generated from the light emitting device;
wherein the plurality of first support members and the plurality of second support members are integrally formed with the first surface of the lens body;
wherein the third surface appears flat in a cross-sectional view of the lens body taken through a plane having the optical axis of the lens;

wherein the first surface is perpendicular to the optical axis and is flat; and wherein the optical axis goes through the first surface, and the flange unit is adjacent to the first surface.

16. The light apparatus of claim 15, wherein an adhesive material is interposed between the first support members and a floor plate of the grooves, and wherein a distal end of each of the second support members is in direct physical contact with an upper surface of the substrate.

* * * * *